(12) United States Patent
Yoshida et al.

(10) Patent No.: US 6,482,670 B1
(45) Date of Patent: Nov. 19, 2002

(54) SEMICONDUCTOR MANUFACTURING UNIT AND SEMICONDUCTOR MANUFACTURING METHOD

(75) Inventors: Seiichi Yoshida, Sagamihara (JP); Shingo Watanabe, Aikawa-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/661,304

(22) Filed: Sep. 13, 2000

(30) Foreign Application Priority Data

Sep. 14, 1999 (JP) .......................................... 11-260547

(51) Int. Cl.[7] .............................................. H01L 21/00
(52) U.S. Cl. ......................................... 438/75; 136/205
(58) Field of Search ............................ 219/200; 432/1; 438/19, 795; 136/75, 205; 320/1

(56) References Cited

U.S. PATENT DOCUMENTS 3,899,359 A * 8/1975 Starchurski ................. 136/205
4,348,580 A * 9/1982 Drexel ........................ 219/390
5,824,561 A * 10/1998 Kishi et al. ................... 438/55

* cited by examiner

*Primary Examiner*—John F. Niebling
*Assistant Examiner*—Christopher Lattin
(74) *Attorney, Agent, or Firm*—Smith, Gambrell & Russell, LLP

(57) ABSTRACT

A semiconductor manufacturing unit according to the invention includes a processing container into which a semiconductor substrate is adapted to be conveyed. A heating unit is adapted to heat an atmosphere in the processing container in order to thermally process the semiconductor substrate. A plane thermoelectric module having a first surface is arranged opposite to an area heated by the heating unit, for converting a thermal energy of the area into an electric energy by making use of Seebeck effect. According to the feature, the thermal energy which has been disposed in conventional units can be used as the electric energy. Thus, total energy efficiency of the semiconductor manufacturing unit can be raised.

13 Claims, 6 Drawing Sheets

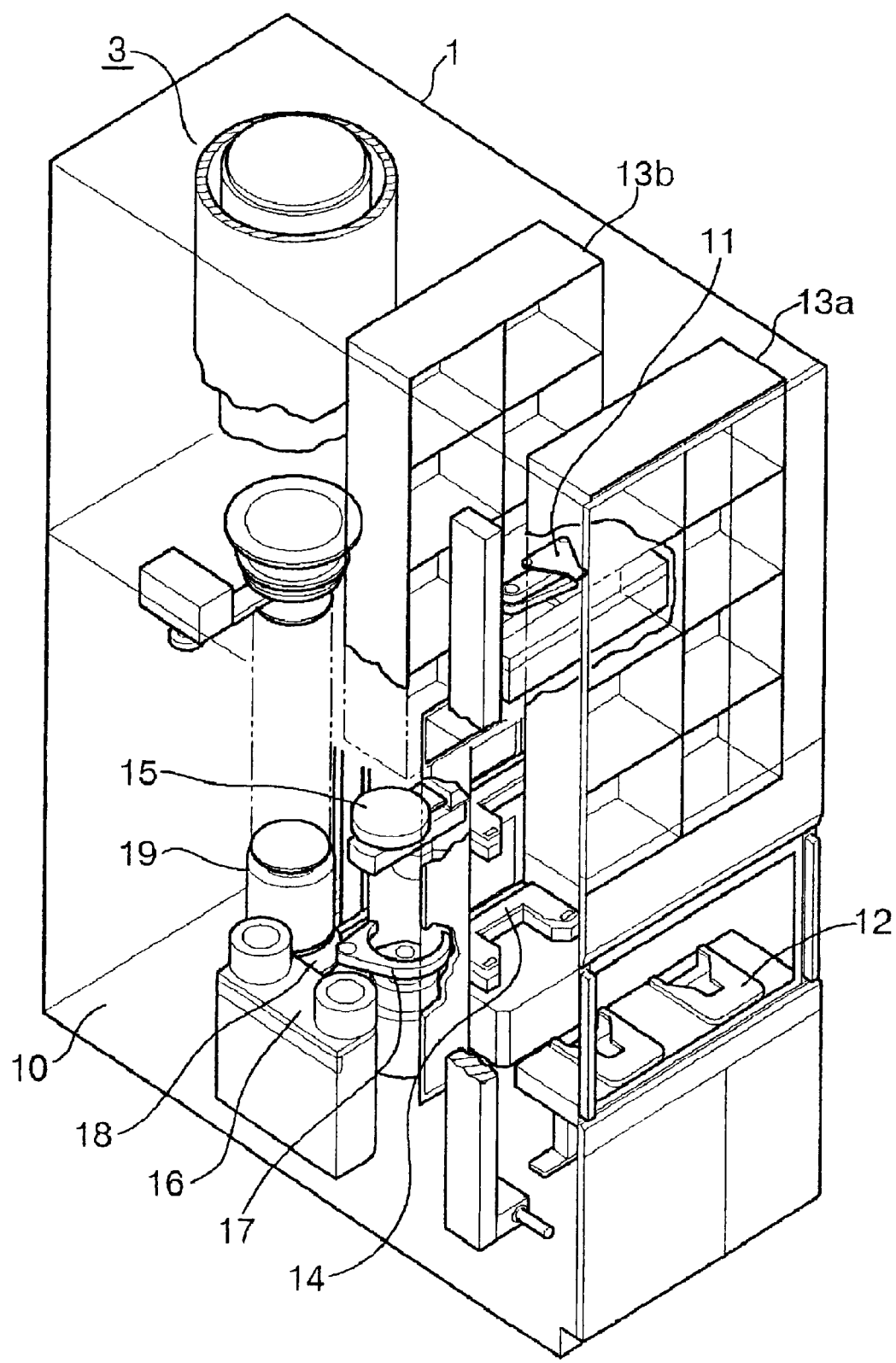
F I G. 1

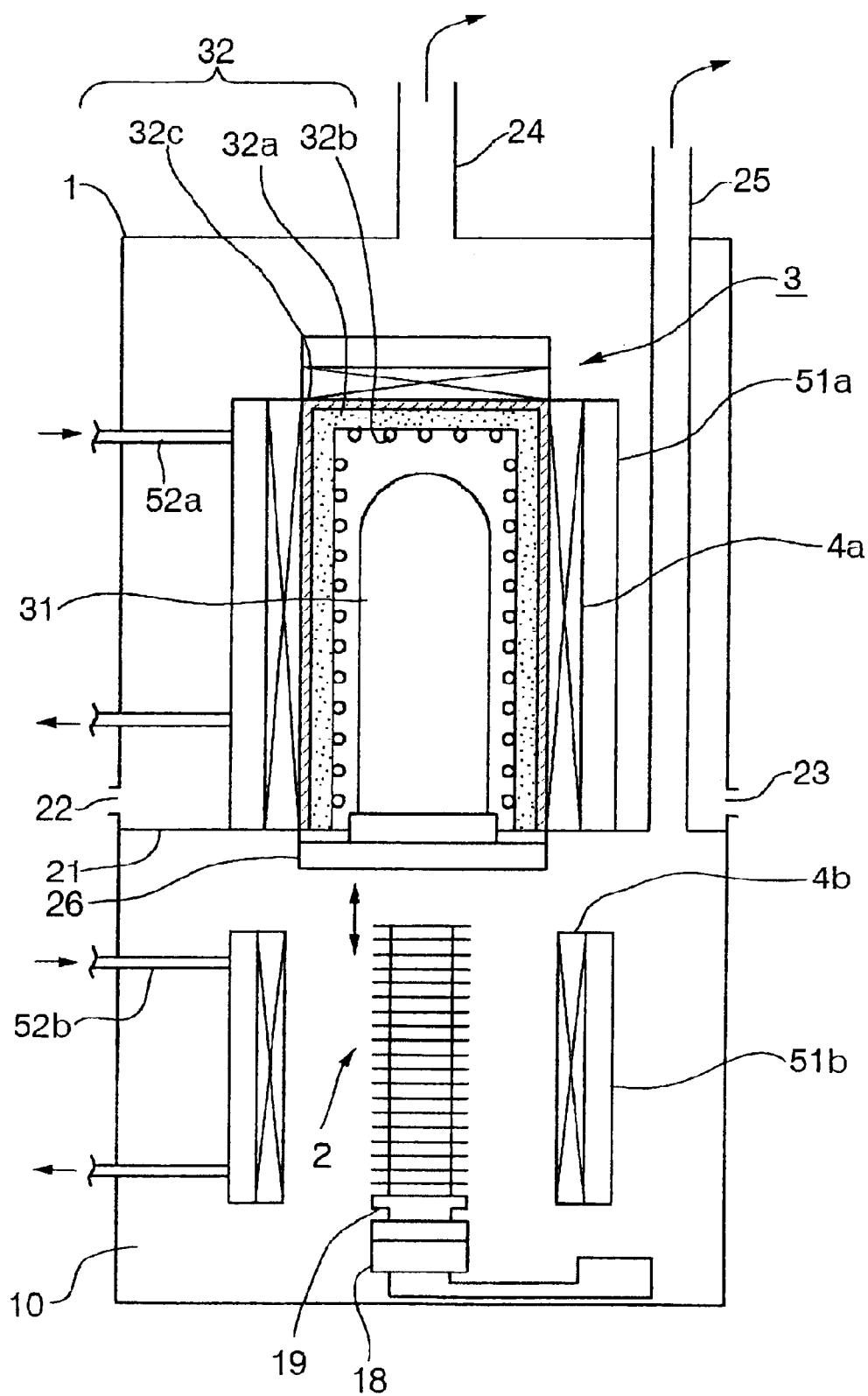
F I G. 2

SEMICONDUCTOR MANUFACTURING UNIT AND SEMICONDUCTOR MANUFACTURING METHOD

BACKGROUND OF THE INVENTION

1. Field of the Invention

This invention relates to a semiconductor manufacturing unit and a semiconductor manufacturing method for conducting a thermal process to a semiconductor substrate such as a semiconductor wafer.

2. Disclosure of the Prior Art

As a conventional semiconductor-manufacturing unit, there is known a vertical thermal processing unit which can conduct a process to a plurality of semiconductor wafers at one time. In such a unit, the plurality of the semiconductor wafers are held in a tier-like manner by a wafer holder, which is called a wafer-boat. After that, the wafer holder is conveyed into a vertical thermal processing furnace, which has a heater such as a resistance heater, through a lower portion thereof. Then, an atmosphere in the furnace is heated to a predetermined temperature in order to conduct a thermal process to the plurality of semiconductor wafers. The thermal process may be, for example, a CVD process, a diversion process, an oxidation process, or the like. In a CVD process, the atmosphere in the vertical thermal processing furnace is heated up to, for example about 500–800° C. In a diversion process or an oxidation process, the atmosphere in the vertical thermal processing furnace is heated up to, for example more than 800° C.

Thus, a thermal process to the wafers is conducted at a high temperature. In general, residual heat is exhausted through a wall surrounding the vertical thermal processing furnace and/or a duct provided at a loading chamber of the wafer boat. Alternatively, residual heat is forcibly collected by a cooling medium such as a cooling water flowing through a cooling pass provided around the vertical thermal processing furnace, and the collected heat is disposed.

As described above, energy of the residual heat produced in the thermal process to the wafers has been disposed in vain. In addition, there has been a problem that exhausting or collecting (cooling) the residual heat as described above requires large electric power involving a high cost. Especially, when a wafer has a size of 300 mm, a heater for heating the wafer has to be large correspondingly to the size of the wafer. In the case, energy of residual heat is liable to be larger. Thus, disposed energy of the heat is also liable to be larger, which makes worse an energy efficiency of a semiconductor manufacturing plant.

SUMMARY OF THE INVENTION

This invention is intended to solve the above problem effectively. The object of this invention is to provide a semiconductor manufacturing unit which can be used with a high energy efficiency.

In order to achieve the object, a semiconductor manufacturing unit according to the invention is characterized by comprising: a processing container into which a semiconductor substrate is adapted to be conveyed; a heating unit for heating an atmosphere in the processing container in order to thermally process the semiconductor substrate; and a plane thermoelectric module having a first surface arranged opposite to an area heated by the heating unit for converting a thermal energy of the area into an electric energy by making use of Seebeck effect.

According to the feature, since the thermal energy which has been disposed in conventional units can be used as the electric energy, total energy efficiency of the semiconductor manufacturing unit can be raised.

Preferably, the plane thermoelectric module has a second surface, and a cooling unit is provided in the second surface in order to improve an efficiency of the Seebeck effect.

Preferably, an insulating material is arranged between the area heated by the heating unit and the thermoelectric module.

Preferably, the thermoelectric module is connected to a rechargeable battery. For example, the rechargeable battery may be adapted to function as a backup power source for the semiconductor manufacturing unit.

Preferably, the area heated by the heating unit is formed in such a manner that the area surrounds the processing container. In the case, the thermoelectric module may be arranged in such a manner that the thermoelectric module surrounds the area heated by the heating unit and that the first surface of the thermoelectric module is opposite to an outside of the area.

Preferably, the container is formed in such a manner that a substrate holder for holding a plurality of semiconductor substrate in a tier-like manner can be conveyed into the container.

Preferably, the substrate holder is adapted to wait at a waiting position when the substrate holder is taken out from the container, and a second thermoelectric module is arranged around the waiting position in such a manner that a first surface of the second thermoelectric module is opposite to the waiting position.

In the case, preferably, the second thermoelectric module has a second surface, and a cooling unit is provided in the second surface in order to improve an efficiency of Seebeck effect. Further preferably, the second thermoelectric module is connected to a rechargeable battery. The rechargeable battery may also be adapted to function as a backup power source for the semiconductor manufacturing unit.

In addition, a semiconductor manufacturing method according to the invention is a method of using a semiconductor processing unit including: a processing container into which a semiconductor substrate is adapted to be conveyed; a heating unit for heating an atmosphere in the processing container in order to thermally process the semiconductor substrate; and a plane thermoelectric module having a first surface arranged opposite to an area heated by the heating unit for converting a thermal energy of the area into an electric energy by making use of Seebeck effect; comprising: a step of conveying the semiconductor substrate into the container; a step of thermally processing the semiconductor substrate in the container by means of the heating unit; and a step of converting the thermal energy of the area heated by the heating unit into the electric energy by means of the thermoelectric module.

Preferably, the plane thermoelectric module of the semiconductor manufacturing unit has a second surface, a cooling unit is provided in the second surface in order to improve an efficiency of the Seebeck effect, and the method further comprises a step of cooling the second surface of the thermoelectric module by means of the cooling unit.

In addition, preferably, the thermoelectric module of the semiconductor manufacturing unit is connected to a rechargeable battery, and the method further comprises a step of charging the rechargeable battery with the electric energy converted by the thermoelectric module.

BRIEF DESCRIPTION OF THE DRAWINGS

FIG. 1 is a schematic perspective view of an embodiment of a semiconductor manufacturing unit according to the invention;

FIG. 2 is a schematic sectional view of the embodiment of the semiconductor manufacturing unit;

DESCRIPTION OF THE PREFERRED EMBODIMENT

Figure 3:
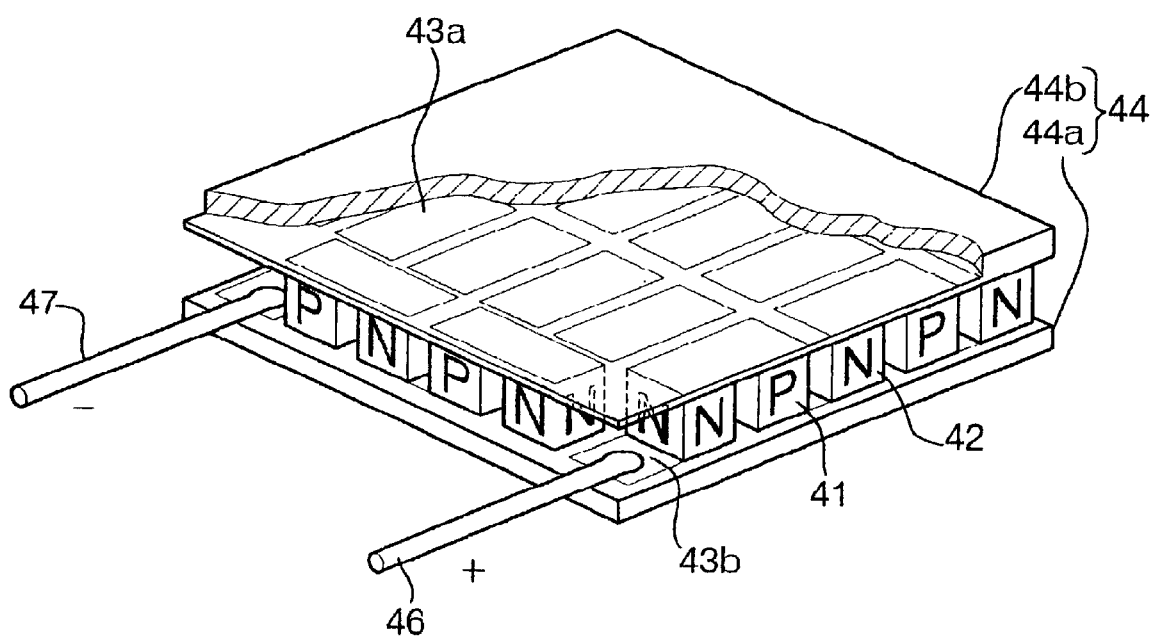
FIG. 3 is a schematic perspective view of a plane thermoelectric module.

FIG. 1 is a schematic view of an example of a vertical thermal processing unit that is an embodiment of a semiconductor manufacturing unit according to the invention.

A numerical sign 1 in FIG. 1 designates a box that defines a covering wall of the unit. A plurality of wafers W, for example 15 wafers W as semiconductor substrates (objects to be processed) are set in a closed-type carrier that is not shown. The carrier is adapted to be conveyed from a carrier port 12 onto a transfer stage 14 by means of a carrier conveying mechanism 11, directly or after the carrier is once conveyed in a carrier stock 13a(13b) provided in the box 1. The transfer stage 14 is provided in a front portion with respect to a dividing plate(not shown), which divides an atmosphere in the box 1 into the front portion and a rear portion (a loading area 10). The closed-type carrier is put on the transfer stage 14, then a lid of the carrier is opened when a door of the dividing plate is opened. The wafers W in the carrier are conveyed onto a wafer boat 2 on a boat-stage 16 by a wafer-conveying unit 15 (see FIG. 2). The wafer boat 2 is put on a thermal cylinder 19 on a boat elevator 18, which can vertically move, by another wafer-conveying unit 17.

FIG. 2 is a schematic sectional view of the loading area 10 and a vertical thermal processing furnace 3 of the thermal processing unit shown in FIG. 1. The vertical thermal processing furnace 3 is arranged above the loading area 10. A horizontal dividing plate 21 is arranged between an outside space of the vertical thermal processing furnace and a lower portion of the loading area 10. Air inlets 22 and 23 are formed at portions just above the dividing plate 21, respectively. Air in an upper portion with respect to the dividing plate 21 is adapted to be exhausted through a first exhausting duct 24 connected to a ceiling of the box 1. In addition, a second exhausting duct 25 is inserted from the ceiling of the box 1 into the loading area 10 through the dividing plate 21. Thus, air in the loading area 10 is adapted to be exhausted through the second exhausting duct 25.

A supporting unit 26 is provided in a center portion of the dividing plate 21. A lower end of the vertical thermal processing furnace 3 is supported by the supporting unit 26. The vertical thermal processing furnace 3 mainly consists of: a crystal tube 31 as a reaction tube having a lower open end, and a furnace body 32 arranged in such a manner that the furnace body 32 surrounds the crystal tube 31. An inside portion of the furnace body 32 consists of an insulating material 32a. A heating unit 32b such as a resistant heater coils itself on an inside surface of the insulating material 32a.

One (inside) surface of a thermoelectric module 4a is stuck to an entire outside wall 32c of the cylindrical furnace body 32. Thus, the one surface of the thermoelectric module 4a is adapted to be heated by heat conducted from the furnace body 32. On the other hand, the other (outside) surface of the thermoelectric module 4a is fully covered with a cooling jacket 51a. That is, the thermoelectric module 4a is sandwiched between the furnace body 32 and the cooling jacket 51a.

Then, the loading area 10 will be explained. The wafer-boat 2 can be conveyed into the crystal tube 31 by the boat-elevator 18 vertically moving up. The boat-elevator 18 also functions as a lid of the crystal tube 31, that is, the open end of the crystal tube 31 is closed by the boat-elevator 18 when the wafer-boat 2 is set into the crystal tube 31. In addition, a second thermoelectric module 4b is arranged in a side area of the wafer-boat 2 at a lowest position thereof (a position shown in FIG. 2) in such a manner that one (inside) surface of the thermoelectric module 4b surrounds the wafer boat 2 at the lowest position. The one surface of the second thermoelectric module 4b is adapted to be heated by radiant heat from the wafer-boat 2 and the wafers W which have been heated in the vertical thermal processing furnace 3. The other (outside) surface of the second thermoelectric module 4b is covered with a cooling jacket 51b.

Cooling medium passes 52a and 52b are provided in the cooling jackets 51a and 51b, respectively. The cooling medium passes 52a and 52b are connected to a cooling medium supplying source (not shown). The cooling medium supplying source is adapted to supply a cooling medium such as cooling water into the cooling medium passes 52a and 52b. The cooling water cools down the outside surface (s) of the thermoelectric module 4 (4a, 4b).

Each of the thermoelectric modules 4a and 4b is an assembly consisting of a plurality of the thermoelectric modules 4. In FIG. 2, the plurality of thermoelectric modules 4 are shown as an unity, for the convenience of the illustration.

FIG. 3 is a perspective view of a thermoelectric module 4. The thermoelectric module 4 includes arrayed thermoelectric devices, each of which consists of a pair of a P-type semiconductor 41 and a N-type semiconductor 42. The upper surfaces of the P-type semiconductor and the N-type semiconductor of each pair are connected each other by a metal electrode 43 to form a π-type device. The lower surfaces of a plurality of π-type devices are connected in a series manner by a metal electrode 43b. Then, the plurality of π-type devices are sandwiched between a upper and a lower electric insulating plates 44. Thus, a series connection of a first P-type semiconductor 41—the metal electrode 43a—a N-type semiconductor—the metal electrode 43b—a second P-type semiconductor— ... —a n-th N-type semiconductor is formed. Both ends of the series connection (circuit) are connected to a negative electrode 47 and a positive electrode 46, respectively, in order to take out electric power.

In the thermoelectric module(s) 4, a potential deference between the P-type semiconductor 41 and the N-type semiconductor 42 is generated from a deference in temperature between the upper and the lower electric insulating plates 44 (Seebeck effect). The potential difference is taken out as electric power. One surface of the electric insulating plate 44 is adapted to be a high temperature portion 44a, and the other surface of the electric insulating plate 44 is adapted to be a low temperature portion 44b. The lower surface of the electric insulating plate 44 which is stuck to the outside wall 32c of the furnace body 32 in FIG. 3 is to be a high temperature portion, and the upper surface thereof which is covered with the cooling jacket 51a in FIG. 3 is to be the low temperature portion 44.

Figure 4:
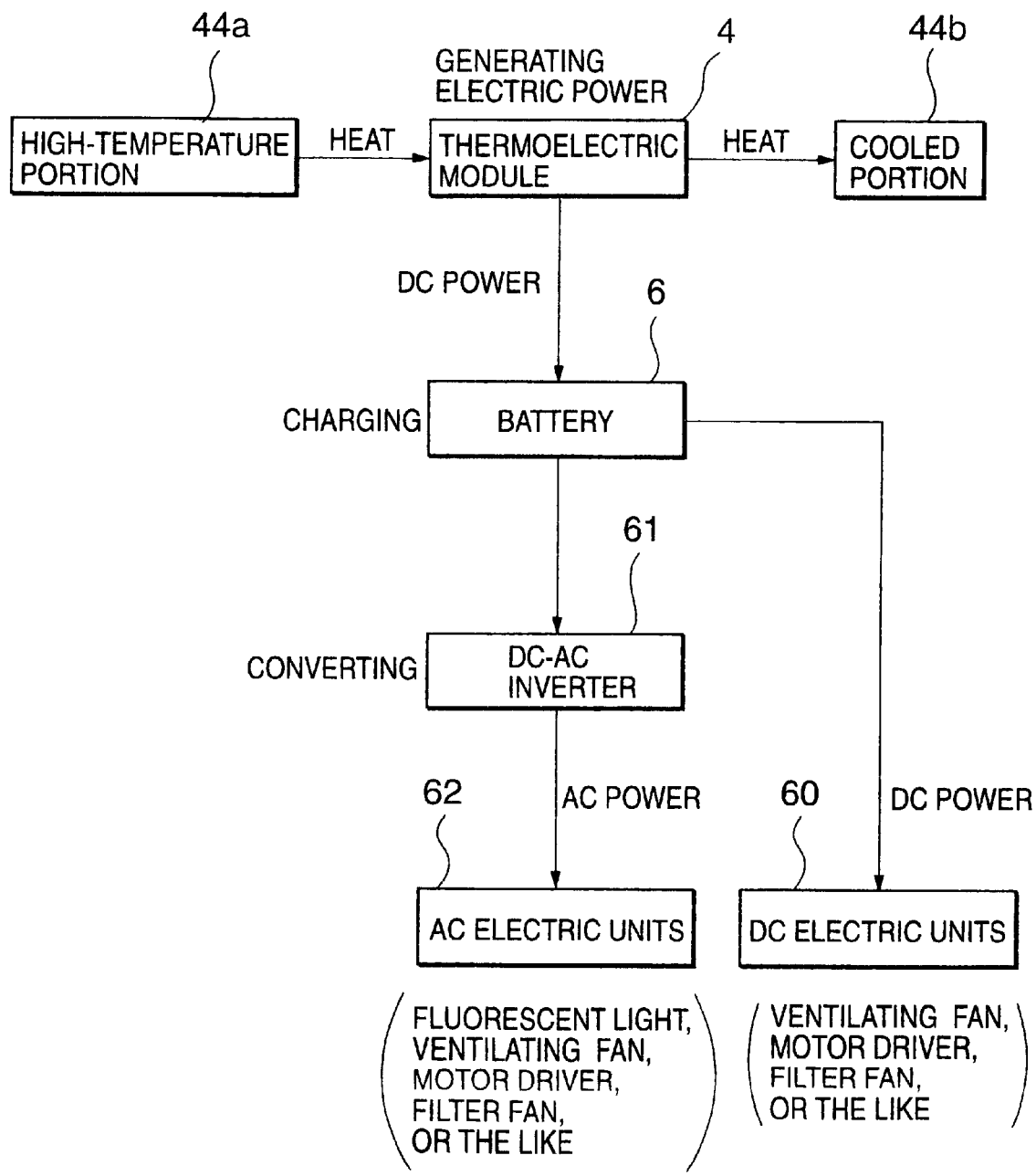
FIG. 4 is a diagram for explaining an example of using electric energy that is converted from thermal energy.

As shown in FIG. 4, the positive electrode 46 and the negative electrode 47 are connected to a rechargeable battery 6. The battery 6 is adapted to be charged by the electric power obtained from the positive electrode 46 and the negative electrode 47. In addition, the battery 6 is connected to electric units 60, which utilize direct current, used in a semiconductor manufacturing factory, and is connected through a DC (direct current)—AC (alternating current) inverter 61 to electric units 62 which utilize alternating current, used in the semiconductor manufacturing factory. Alternatively, the battery 6 may be used as a backup power source during a power failure in the factory.

Then, an operation of the unit described above is explained. First, the wafer boat 2, on which a plurality of wafers for example 100 wafers W have been put, is conveyed into the crystal tube 31 by the boat elevator 18. The lower open end of the crystal tube 31 is sealed by the lid portion of the upper end of the boat elevator 18. Next, the atmosphere in the crystal tube 31 is heated to the predetermined temperature, for example about 900° C., by means of the heating unit 32b. Then, the predetermined thermal process, for example an oxidation process is conducted to the wafers W. An air is taken into the vertical processing furnace 3 through the inlets 22 and 23. Then, an air in the vertical processing furnace 3 is exhausted through the first exhausting duct 24 by a fan (not shown).

A thermal energy radiated from the heating unit 32b during the process is conducted to the outside wall 32c through the insulating material 32a. Thus, the outside wall 32c is heated up to, for example about 250° C. Thus, the inside surface of thermoelectric module 4, which faces the outside wall 32c, is also heated up to, for example about 250° C. On the other hand, in the cooling jacket 51a, the cooling water is flowed from the cooling medium supplying source (not shown)into the cooling pass 52a by a cooling control system (not shown). A temperature of the outside surface of the thermoelectric module 4a, which faces the cooling jacket 51a, is controlled to be for example about 30° C. The cooling control system controls for example a temperature and/or a flow rate of the cooling water flowing into the cooling pass 52a. Thus, the inside surface of the thermoelectric module 4a bocomes the high temperature portion 44a, and the other(outside) surface of the thermoelectric module 4a becomes the low temperature portion 44b. Then, a temperature inclination is generated from the inside surface to the outside surface of the thermoelectric module 4a.

After the predetermined process has been completed, the boat elevator 18 moves down. Then, the wafer boat 2 moves down from the open end of the crystal tube 31. The inside surface of the thermoelectric module 4b, which encircles the lowest (waiting) position of the wafer boat 2, is heated up to for example about 100° C. by the radiant heat from the wafers W and the wafer boat 2 which have been heated up to the high temperature as described above. The outside surface of the thermoelectric module 4b is cooled down to for example about 30° C. by the cooling jacket 51a, similarly to the outside surface of the thermoelectric module 4a. Thus, a temperature inclination is also generated from the inside surface to the outside surface of the thermoelectric module 4b.

Figure 6A:
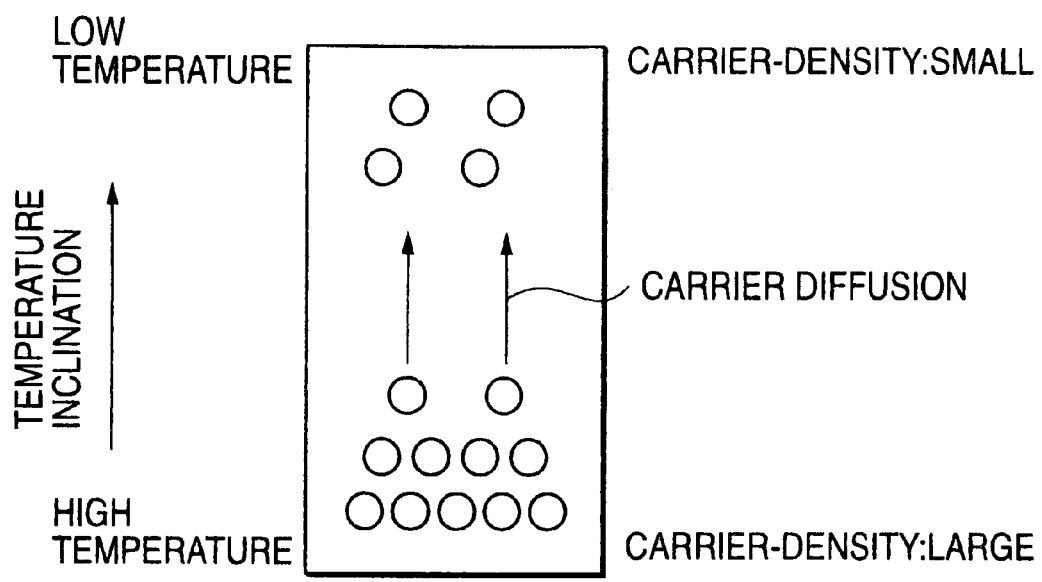
FIGS. 6A and 6B are schematic views for explaining Seebeck effect occurring in the plane thermoelectric module.
Figure 6B:
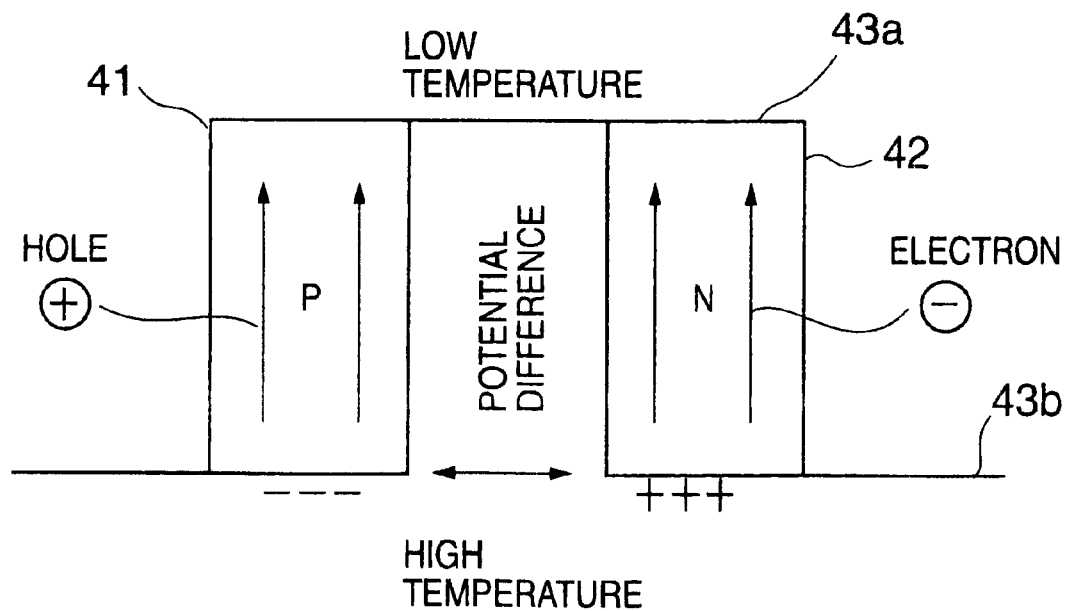

While the one surface of the electric insulating plate 44 is kept as the high temperature portion 44a and the other surface of the electric insulating plate 44 is kept as the low temperature portion 44b, as shown in FIG. 6A, carriers for conveying energy transfer from the high temperature area to the low temperature area in the P-type semiconductor 41 and the N-type semiconductor 42 because of the temperature inclination. In the P-type semiconductor 41, as holes having positive charges transfer to the low temperature area, the high temperature area has a negative electric potential. On the other hand, in the N-type semiconductor 42, as electrons having negative charges transfer to the high temperature area, the low temperature area has a positive electron potential because of the shortage of the electrons. That is called a carrier diffusion flow. Thus, a potential gap between the two electrodes is generated from the carrier diffusion flow, which is called Seebeck effect. That is, in the thermoelectric module 4 of the unit, electric power is taken out by using the Seebeck effect (As shown in FIG. 6B).

The electric power taken out by the Seebeck effect is electric power of direct current. The power may be charged once into the battery 6. Then, the power may be supplied to electric units 60 which are used in the semiconductor manufacturing unit, for example a ventilating fan, a motor driver, a filter fan or the like. The power of direct current from the battery 6 may be converted to power of alternating current by the inverter 61, then the power of alternating current may be supplied to the electric units 62, for example a fluorescent light, a motor driver, a filter fan or the like (see FIG. 4).

According to the embodiment, the electric power can be obtained by using Seebeck effect, that is, by making use of the heat radiated from the furnace body 32, the wafer boat 2 and/or the wafers W. Thus, the radiant heat, which has been disposed in the prior art, can be efficiently utilized as the electric energy. For example, the obtained electric power may be supplied to various units in the semiconductor manufacturing unit, which can improve the energy efficiency in operating the whole of the unit. When generating the electric power from the radiated heat, since the one surface of the thermoelectric module 4a is stuck to the outside wall of the furnace body 32 and the other surface of the thermoelectric module 4a is forcibly cooled by the cooling jacket 51a, greater temperature inclination may be formed and larger electric power may be obtained.

Figure 5:
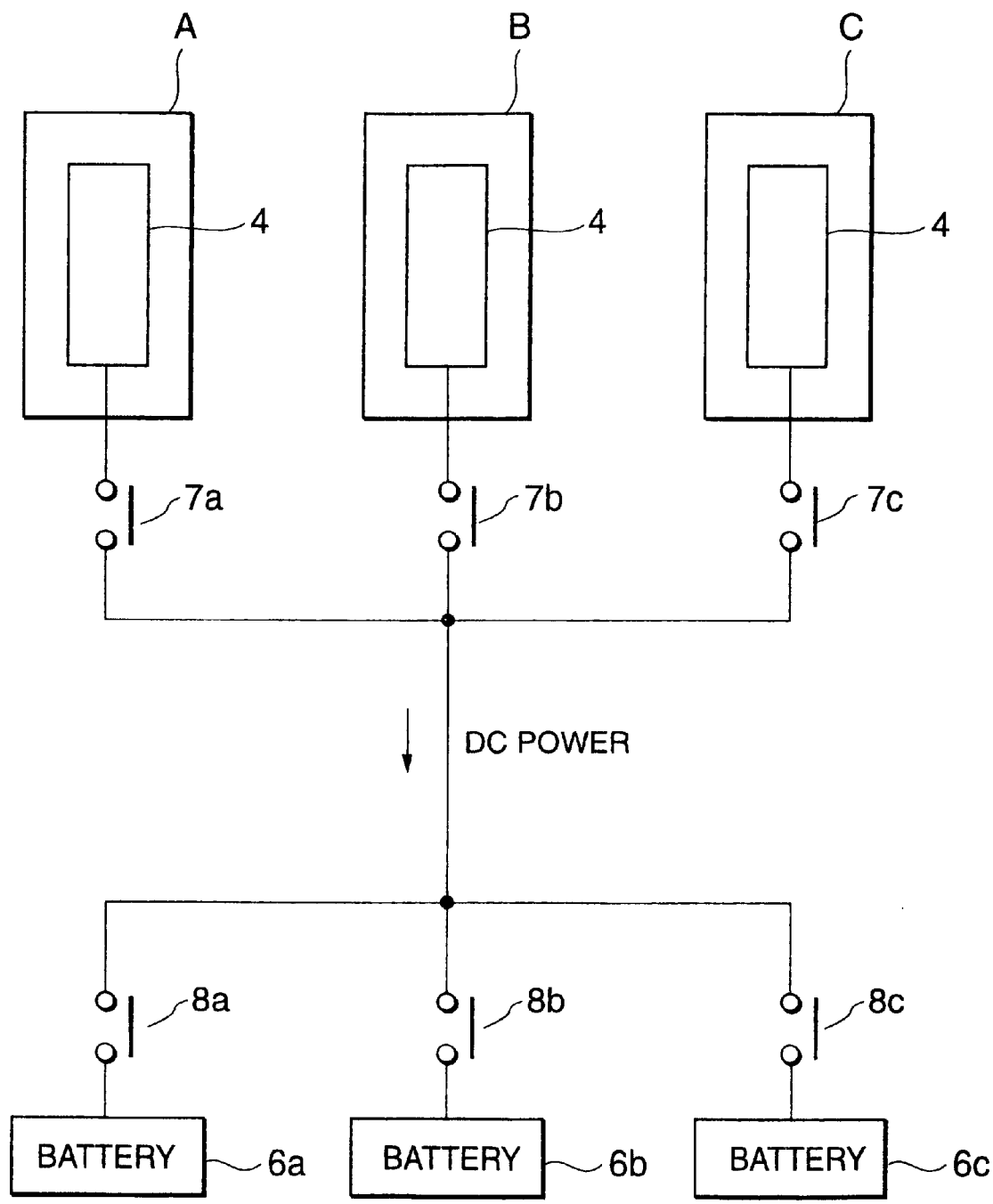
FIG. 5 is a diagram for explaining another example of using electric energy that is converted from thermal energy.

The semiconductor manufacturing unit provided with the thermoelectric module 4 may be connected to one battery 6. Alternatively, as shown in FIG. 5, the unit may include switching members 7a, 7b and 7c, each of which consists of for example a relay-contact that can independently open and close, for choosing one of the thermal electric modules 4 provided in the semiconductor manufacturing units A, B and C, respectively. The unit may also include switching members 8a, 8b and 8c, each of which consists of for example a relay-contact that can independently open and close, for choosing one of the batteries 6a, 6b and 6c provided in the semiconductor manufacturing units A, B and C, respectively. In the case, each of semiconductor manufacturing units A, B and C can be selectively connected to any one of batteries 6a, 6b and 6c through the switching members 7a–7c and 8a–8c. In the case, the electric power may be supplied to the batteries 6a, 6b and 6c in proportion to charged conditions of the batteries 6a, 6b and 6c. Thus, the electric power obtained from the thermoelectric module 4 can be utilized more efficiently. The one unit may be assigned to the plurality of the batteries.

In the embodiment described above, between the thermoelectric module 4a and the outside wall 32c of the furnace body 32, a gap may be formed in such a manner that the gap may not deteriorate thermal conductivity therebetween. In addition, a thermoelectric module can be provided on or above an outside surface of a processing container for a single substrate which may have heating lamps. A thermoelectric module may be arranged around an exhausting duct connected to the processing container. Alternatively, the invention can be applied to a baking unit, which is used in a pre-process or a post-process to a wafer or a liquid-crystal display substrate when the wafer or the substrate undergoes an application of a resistant-material or a developing process.

What is claimed is:

1. A semiconductor manufacturing unit comprising:
    a processing container into which a semiconductor substrate is adapted to be conveyed,
    a heating unit for heating an atmosphere in the processing container in order to thermally process the semiconductor substrate, and
    a plane thermoelectric module having a first surface arranged opposite to an area heated by the heating unit for converting thermal energy of the area into electric energy that can be utilized as electric power by making use of the Seebeck effect;
    wherein the area heated by the heating unit is formed in such a manner that the area surrounds the processing container; and
    further wherein the thermoelectric module is arranged in such a manner that the thermoelectric module surrounds the area heated by the heating unit and that the first surface of the thermoelectric module is opposite to an outside of the area.

2. A semiconductor manufacturing unit according to claim 1, wherein:
    the plane thermoelectric module has a second surface, and
    a cooling unit is provided in the second surface in order to improve an efficiency of the Seebeck effect.

3. A semiconductor manufacturing unit according to claim 1, further comprising:
    an insulating material arranged between the area heated by the heating unit and the thermoelectric module.

4. A semiconductor manufacturing unit according to claim 1, wherein:
    the thermoelectric module is connected to a rechargeable battery.

5. A semiconductor manufacturing unit according to claim 4, wherein:
    the rechargeable battery is adapted to function as a backup power source for the semiconductor manufacturing unit.

6. A semiconductor manufacturing unit according to claim 1, wherein:
    the container is formed in such a manner that a substrate holder for holding a plurality of semiconductor substrates in a tier-like manner can be conveyed into the container.

7. A semiconductor manufacturing unit comprising:
    a processing container into which a semiconductor substrate is adapted to be conveyed,
    a heating unit for heating an atmosphere in the processing container in order to thermally process the semiconductor substrate, and
    a plane thermoelectric module having a first surface arranged opposite to an area heated by the heating unit for converting thermal energy of the area into electric energy that can be utilized as electric power by making use of the Seebeck effect;
    wherein the container is formed in such a manner that a substrate holder for holding a plurality of semiconductor substrates in a tier-like manner can be conveyed into the container, the substrate holder being adapted to wait at a waiting position when the substrate holder is taken out from the container,
    wherein a second thermoelectric module is arranged around the waiting position in such a manner that a first surface of the second thermoelectric module is opposite to the waiting position.

8. A semiconductor manufacturing unit according to claim 7, wherein:
    the second thermoelectric module has a second surface, and
    a cooling unit is provided in the second surface in order to improve an efficiency of Seebeck effect.

9. A semiconductor manufacturing unit according to claim 7, wherein:
    the second thermoelectric module is connected to a rechargeable battery.

10. A semiconductor manufacturing unit according to claim 9, wherein:
    the rechargeable battery is adapted to function as a backup power source for the semiconductor manufacturing unit.

11. A method of using a semiconductor processing unit including:
    a processing container into which a semiconductor substrate is adapted to be conveyed;
    a heating unit for heating an atmosphere in the processing container in order to thermally process the semiconductor substrate, and
    a plane thermoelectric module having a first surface arranged opposite to an area heated by the heating unit for converting thermal energy of the area into electric energy that can be utilized as electric power by making use of the Seebeck effect,
    wherein the area heated by the heating unit is formed in such a manner that the area surrounds the processing container; and
    further wherein the thermoelectric module is arranged in such a manner that the thermoelectric module surrounds the area heated by the heating unit and that the first surface of the thermoelectric module is opposite to an outside of the area;
    said method comprising:
    a step of conveying the semiconductor substrate into the container,
    a step of thermally processing the semiconductor substrate in the container by means of the heating unit, and
    a step of converting the thermal energy of the area heated by the heating unit into electric energy that can be utilized as electric power by means of the thermoelectric module.

12. A method according to claim 11, wherein:
    the plane thermoelectric module of the semiconductor manufacturing unit has a second surface,
    a cooling unit is provided in the second surface in order to improve an efficiency of the Seebeck effect, and
    the method further comprises a step of cooling the second surface of the thermoelectric module by means of the cooling unit.

13. A method according to claim 11, wherein:
    the thermoelectric module of the semiconductor manufacturing unit is connected to a rechargeable battery, and
    the method further comprises a step of charging the rechargeable battery with the electric energy converted by the thermoelectric module.

* * * * *